(12) United States Patent
Ito

(10) Patent No.: US 11,678,544 B2
(45) Date of Patent: Jun. 13, 2023

(54) DISPLAY DEVICE AND METHOD OF MANUFACTURING DISPLAY DEVICE

(71) Applicant: Japan Display Inc., Tokyo (JP)

(72) Inventor: Masato Ito, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/473,234

(22) Filed: Sep. 13, 2021

(65) Prior Publication Data

US 2021/0408213 A1 Dec. 30, 2021

Related U.S. Application Data

(63) Continuation of application No. 16/204,031, filed on Nov. 29, 2018.

(30) Foreign Application Priority Data

Nov. 29, 2017 (JP) .............................. JP2017-228569

(51) Int. Cl.
*H01L 27/32* (2006.01)
*H01L 51/56* (2006.01)
(Continued)

(52) U.S. Cl.
CPC ......... *H10K 59/131* (2023.02); *G09G 3/3225* (2013.01); *H05K 1/189* (2013.01);
(Continued)

(58) Field of Classification Search
CPC . H01L 27/32; H01L 27/3202; H01L 27/3204; H01L 27/3276; H01L 27/3279; H01L 27/3283; H01L 27/3288; H01L 27/3239; H01L 27/329; H01L 27/3246; H01L 27/3248; H01L 27/3251; H01L 27/3253; H01L 27/3225; H01L 27/3258; H01L 27/326; H01L 27/3262; H01L 51/0002; H01L 51/0015; H01L 51/0097; H01L 51/10; H01L 51/102; H01L 51/107; H01L 51/5012; H01L 51/5072; H01L 51/5056; H01L 51/5048; H01L 2251/50;
(Continued)

(56) References Cited

U.S. PATENT DOCUMENTS 8,384,287 B2 2/2013 Tokuda
8,981,360 B2 3/2015 Bilaine
(Continued)

FOREIGN PATENT DOCUMENTS

JP 2008-139025 6/2008
JP 2014-235790 12/2014

*Primary Examiner* — Natalia A Gondarenko
(74) *Attorney, Agent, or Firm* — Maier & Maier, PLLC

(57) ABSTRACT

A display device according to an embodiment of the present invention includes a display panel having a through hole in a display area including a plurality of pixels. The display panel includes a substrate, and an organic light-emitting diode including a first electrode provided above the substrate for each of the pixels, a second electrode provided over the plurality of pixels, and an organic electroluminescence layer arranged between the first electrode and the second electrode. The through hole penetrates at least the second electrode, and the second electrode includes an oxidized part exposed at an inner surface of the through hole.

9 Claims, 5 Drawing Sheets

(51) Int. Cl.
  *H01L 51/52*      (2006.01)
  *G09G 3/3225*     (2016.01)
  *H10K 59/131*     (2023.01)
  *H05K 1/18*       (2006.01)
  *H10K 50/84*      (2023.01)
  *H10K 50/805*     (2023.01)
  *H10K 50/842*     (2023.01)
  *H10K 59/00*      (2023.01)
  *H10K 59/122*     (2023.01)
  *H10K 71/00*      (2023.01)
  *H10K 50/844*     (2023.01)

(52) U.S. Cl.
  CPC ........... *H10K 50/805* (2023.02); *H10K 50/84* (2023.02); *H10K 50/8426* (2023.02); *H10K 59/00* (2023.02); *H10K 59/122* (2023.02); *H10K 71/00* (2023.02); *H05K 2201/10128* (2013.01); *H10K 50/844* (2023.02)

(58) Field of Classification Search
  CPC ..... H01L 2251/5315; H01L 2251/5338; H01L 2251/554; H01L 2251/558; H01L 2924/161; H01L 2924/1615; H01L 2924/16151; H01L 2924/1616; H01L 51/504; H01L 51/52; H01L 51/5203; H01L 51/5209; H01L 51/5212; H01L 51/5215; H01L 51/5221; H01L 51/5225; H01L 51/5231; H01L 51/5237; H01L 51/524; H01L 51/5246; H01L 51/5253; H01L 51/5259; H01L 51/5206; H01L 51/56; H01L 51/5268; H01L 21/0223; H01L 21/02323; H01L 21/02326; H01L 21/3143; H01L 21/3144; H01L 21/3165; H01L 21/02255; H01L 21/31658; H01L 21/76202–76221; H01L 21/76235; H01L 21/02258; H01L 21/3167; H01L 21/02244; H01L 21/02614; H01L 21/164–165; H01L 21/28229; H01L 21/28247; H01L 21/31683–31687; H01L 21/76868; H05K 2201/10128; H05K 1/189; G09G 3/3233; G09G 3/3225; G02F 1/1343; G02F 1/136213; H10K 59/131; H10K 50/805; H10K 50/84; H10K 50/8426; H10K 59/00; H10K 59/122; H10K 71/00; H10K 50/844
  USPC ........................... 257/40, 59, 72; 438/34, 46
  See application file for complete search history.

(56) References Cited

U.S. PATENT DOCUMENTS

| | | | |
|---|---|---|---|
| 2014/0357002 A1* | 12/2014 | Chung | ............... C23C 14/042 |
| | | | 118/301 |
| 2016/0190389 A1* | 6/2016 | Lee | ............... H01L 27/3276 |
| | | | 438/28 |
| 2017/0373268 A1 | 12/2017 | Takahashi | |
| 2018/0069063 A1 | 3/2018 | Kim | |
| 2019/0043939 A1 | 2/2019 | Ozawa | |
| 2019/0123115 A1 | 4/2019 | Sun | |
| 2019/0173053 A1 | 6/2019 | Choi | |
| 2019/0206964 A1 | 7/2019 | Murai | |

\* cited by examiner

DISPLAY DEVICE AND METHOD OF MANUFACTURING DISPLAY DEVICE

CROSS-REFERENCE TO RELATED APPLICATION

The present application is a Continuation of U.S. application Ser. No. 16/204,031 filed Nov. 29, 2018, which claims priority from Japanese Application JP 2017-228569 filed on Nov. 29, 2017, the content of which is hereby incorporated by reference into this application.

BACKGROUND OF THE INVENTION

1. Field of the Invention

One or more embodiments of the present invention relate to a display device and a method of manufacturing a display device.

2. Description of the Related Art

A display device such as an organic electroluminescence display device has a display panel in which a thin-film transistor, an organic light-emitting diode provided for each pixel and the like are formed on a substrate.

JP 2008-139025 A discloses a configuration in which a display panel has, in its display area, a through hole for exposing a structure other than the display panel.

SUMMARY OF THE INVENTION

However, in the conventional configuration as described above, a defect may occur in an organic electroluminescence layer included in the organic light-emitting diode. That is, in the conventional configuration as described above, moisture may infiltrate via an upper electrode film which is included in the organic light-emitting diode and is exposed at the through hole. Therefore, the defect may occur in the organic electroluminescence layer.

In view of the foregoing problem, an object of an embodiment of the invention is to suppress the occurrence of a defect in the organic electroluminescence layer.

1. A display device according to an embodiment of the present invention includes a display panel having a through hole in a display area including a plurality of pixels. The display panel includes a substrate, and an organic light-emitting diode including a first electrode film provided above the substrate for each of the pixels, a second electrode film provided over the plurality of pixels, and an organic electroluminescence layer arranged between the first electrode film and the second electrode film. The through hole penetrates at least the second electrode film, and the second electrode film includes an oxidized part exposed at an inner surface of the through hole.

2. In the display device according to the above-mentioned item 1, the through hole may also penetrate the substrate.

3. In the display device according to the above-mentioned item 1, the second electrode film may have a shape as a single film that surrounds peripheries of the through hole.

4. The display device according to the above-mentioned item 1 may further include: a pixel circuit provided in the pixels; a video signal line which supplies a voltage corresponding to a video signal, to the pixel circuit; and a scanning signal line which applies a voltage to a lighting thin-film transistor included in the pixel circuit. The video signal line and the scanning signal line arranged next to the through hole may be curved to detour around the through hole.

5. In the display device according to the above-mentioned item 1, a structure other than the display panel may be arranged at a position corresponding to the through hole.

6. In the display device according to the above-mentioned item 5, the structure may include at least one of camera, earphone, and microphone.

7. A method of manufacturing a display device according to an embodiment of the present invention is a method of manufacturing a display device that includes a display panel having a display area including a plurality of pixels. The method includes: forming an organic light-emitting diode which includes a first electrode film provided above a substrate for each of the pixels, a second electrode film provided over the plurality of pixels, and an organic electroluminescence layer arranged between the first electrode film and the second electrode film; providing a through hole which exposes a part of the second electrode film, in the display area; and oxidizing a part of the second electrode film exposed at an inner surface of the through hole.

8. In the method of manufacturing a display device according to the above-mentioned item 7, a laser beam may be irradiated in the display area, thus simultaneously carrying out the providing the through hole, and the oxidizing a part of the second electrode film.

9. In the method of manufacturing a display device according to the above-mentioned item 7, the second electrode film may be formed by a single film forming process using a single mask.

DETAILED DESCRIPTION OF THE INVENTION

First Embodiment

Hereinafter, an embodiment of the invention will be described with reference to the drawings.

The disclosure is simply an example. Any change that a person skilled in the art can easily think of without departing from the spirit of the invention should be included in the scope of the invention. In order to clarify the explanation, the drawings may schematically show each part in terms of width, thickness, shape and the like, compared with the actual configurations. However, the drawings are simply an example and should not limit the interpretation of the invention. Also, in the specification and drawings, a component similar to the one already described with reference to a previously described drawing may be denoted by the same reference sign, and detailed explanation of such a component may be omitted where appropriate. Embodiments of the invention can be combined together unless stated otherwise.

In the detailed description of the invention, the term "above/on" or "below/under" to prescribe a positional relation between one component and another component includes not only the case where one component is directly above/on or below/under another component but also the case where a still another component is provided between the two components unless stated otherwise.

Figure 1:
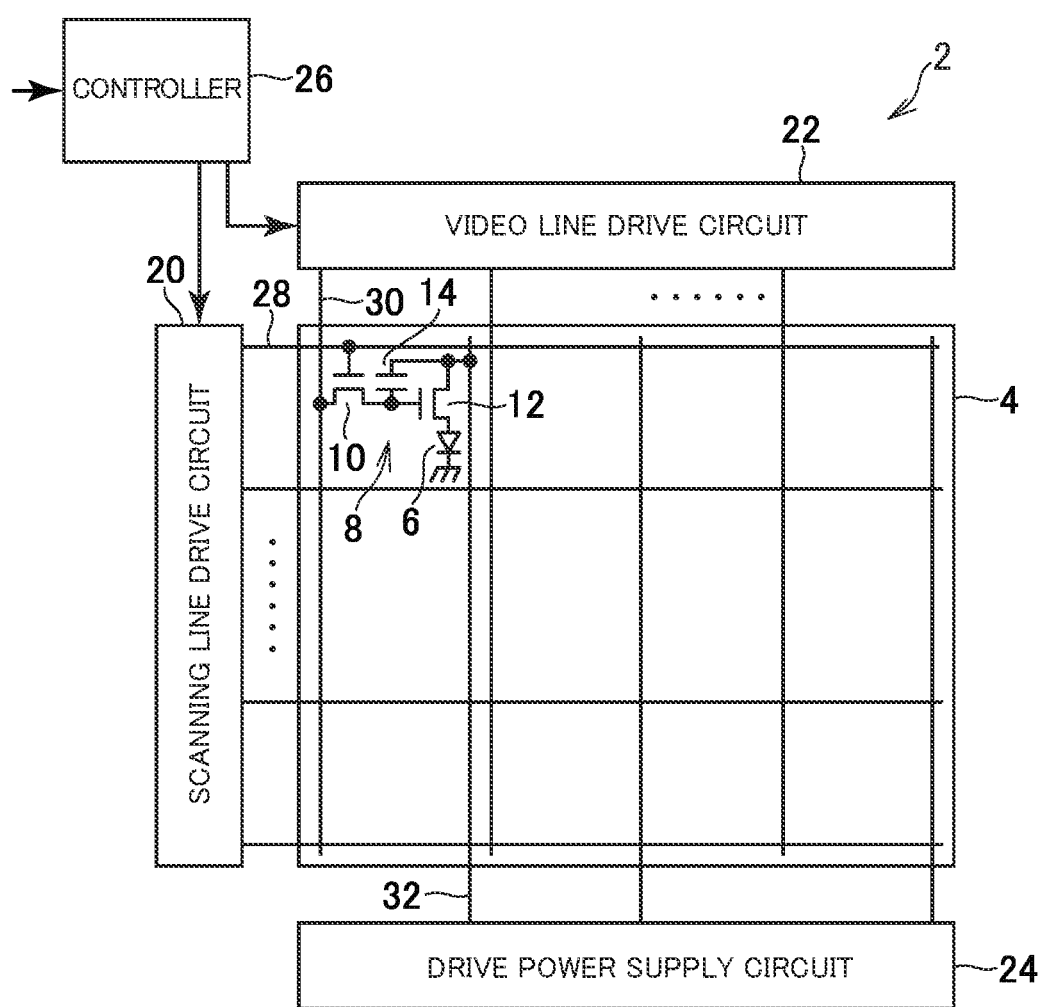
FIG. 1 is a schematic view showing a schematic configuration of a display device according to an embodiment.

A display device 2 according to this embodiment is, for example, an organic electroluminescence display device and mounted on a television, personal computer, mobile terminal, mobile phone or the like. FIG. 1 is a schematic view showing a schematic configuration of the display device 2 according to this embodiment. The display device 2 has a pixel array unit 4 which displays an image, and a drive unit which drives the pixel array unit 4. The display device 2 may have a base material formed of glass or the like. The display device 2 may be a flexible display having flexibility. In such a case, the display device 2 may have a base material formed of a flexible resin film. The display device 2 has a wiring layer including a wiring provided inside or above the base material.

In the pixel array unit 4, an organic light-emitting diode 6 and a pixel circuit 8 are arranged in the form of a matrix corresponding to pixels. The pixel circuit 8 includes a lighting thin-film transistor 10, a drive thin-film transistor 12, a capacitor 14, and the like.

On the other hand, the drive unit includes a scanning line drive circuit 20, a video line drive circuit 22, a drive power supply circuit 24, and a controller 26. The drive unit drives the pixel circuit 8 and controls the light emission of the organic light-emitting diode 6.

The scanning line drive circuit 20 is connected to a scanning signal line 28 provided for each horizontal array of pixels (pixel row). The scanning line drive circuit 20 selects the scanning signal line 28 in order in response to a timing signal inputted from the controller 26 and applies a voltage to the selected scanning signal line 28 to turn on the lighting thin-film transistor 10.

The video line drive circuit 22 is connected to a video signal line 30 provided for each vertical array of pixels (pixel column). The video line drive circuit 22 has a video signal inputted from the controller 26 and outputs to each video signal line 30 a voltage corresponding to the video signal of the selected pixel row in accordance with the selection of the scanning signal line 28 by the scanning line drive circuit 20. The voltage is written into the capacitor 14 via the lighting thin-film transistor 10 in the selected pixel row. The drive thin-film transistor 12 supplies a current corresponding to the written voltage, to the organic light-emitting diode 6. This causes the organic light-emitting diode 6 of the pixel corresponding to the selected scanning signal line 28 to emit light.

The drive power supply circuit 24 is connected to a drive power supply line 32 provided for each pixel column and supplies a current to the organic light-emitting diode 6 via the drive power supply line 32 and the drive thin-film transistor 12 of the selected pixel row.

Here, a lower electrode film which is a first electrode film of the organic light-emitting diode 6 is connected to the drive thin-film transistor 12. On the other hand, an upper electrode film which is a second electrode film of each organic light-emitting diode 6 is formed of an electrode that is used in common by the organic light-emitting diodes 6 of all the pixels. In a case where the lower electrode film is formed as the anode, a high electric potential is inputted thereto, and the upper electrode film is the cathode, to which a low electric potential is inputted. In a case where the lower electrode film is formed as the cathode, a low electric potential is inputted thereto, and the upper electrode film is the anode, to which a high electric potential is inputted.

Figure 2:
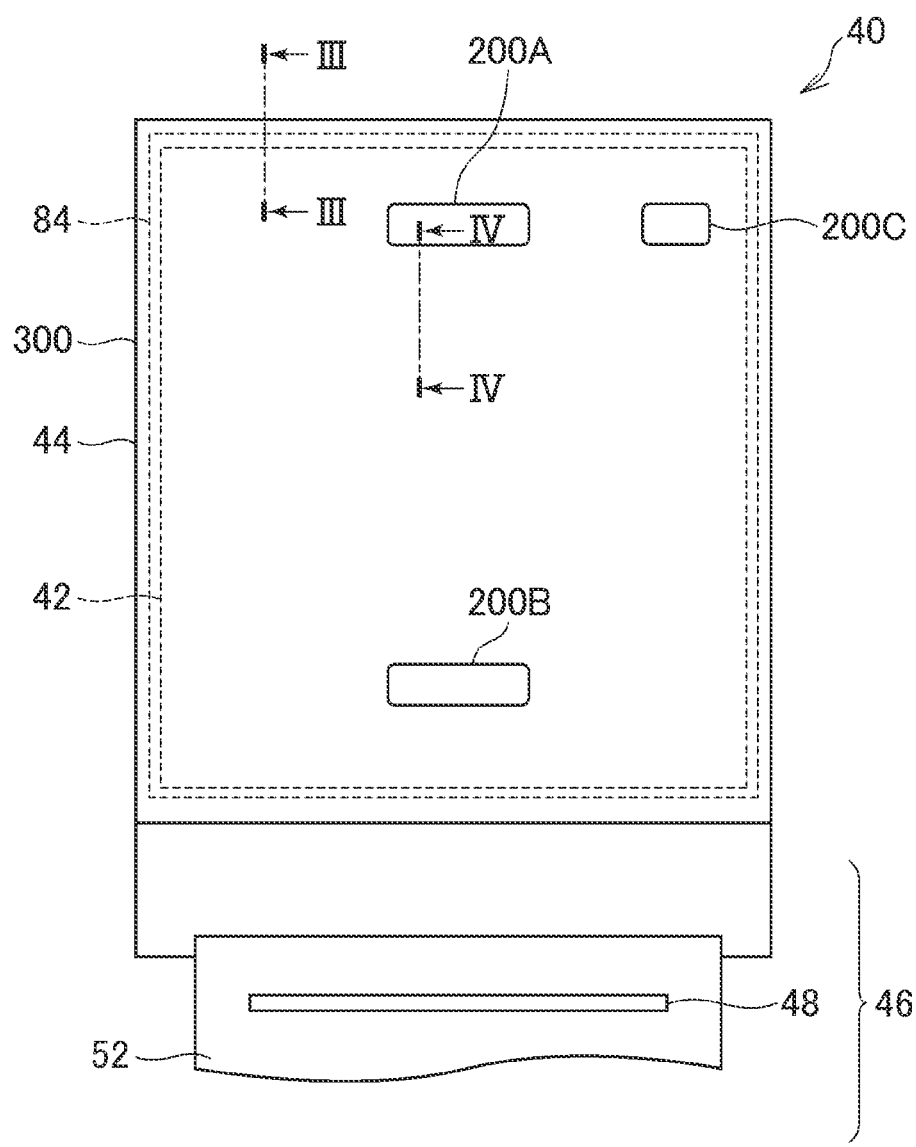
FIG. 2 is a schematic plan view showing a display panel in the display device according to the embodiment.

FIG. 2 is a schematic plan view showing a display panel 40 in this embodiment. The display panel 40 has a display area 42 where the organic light-emitting diode 6 provided in the pixel array unit 4 is arranged, and a frame area 44 arranged on the outer side of the display area 42. Here, the upper electrode film of the organic light-emitting diode 6 is formed in almost the entirety of the display area 42. That is, the upper electrode film is arranged over a plurality of pixels.

As shown in FIG. 2, a flexible printed circuit board 52 is connected to an organic light-emitting diode structure layer 300 including the organic light-emitting diode 6. On the flexible printed circuit board 52, a driver integrated circuit 48 forming the drive unit is mounted. The flexible printed circuit board 52 is connected to the scanning line drive circuit 20, the video line drive circuit 22, the drive power supply circuit 24, and the controller 26 or the like.

The display panel 40 has a through hole 200 arranged at a position corresponding to a structure which doesn't include the display panel 40, such as a camera, earphone, or microphone. In this embodiment, the display panel 40 has a through hole 200A arranged at a position corresponding to an earphone, a through hole 200B arranged at a position corresponding to a microphone, and a through hole 200C arranged at a position corresponding to a camera. The number and shape of through holes 200 are not limited to those in the embodiment. The structure is not limited to the camera, earphone, and microphone. The structure may be arranged below the through hole 200. At least a part of the structure may be arranged inside the through hole 200.

As described above, the upper electrode film of the organic light-emitting diode 6 is formed over the pixels in substantially the entirety of the display area 42. Therefore, a part of the upper electrode film is exposed at the inner surfaces of the through hole 200A, the through hole 200B, and the through hole 200C.

Figure 5:
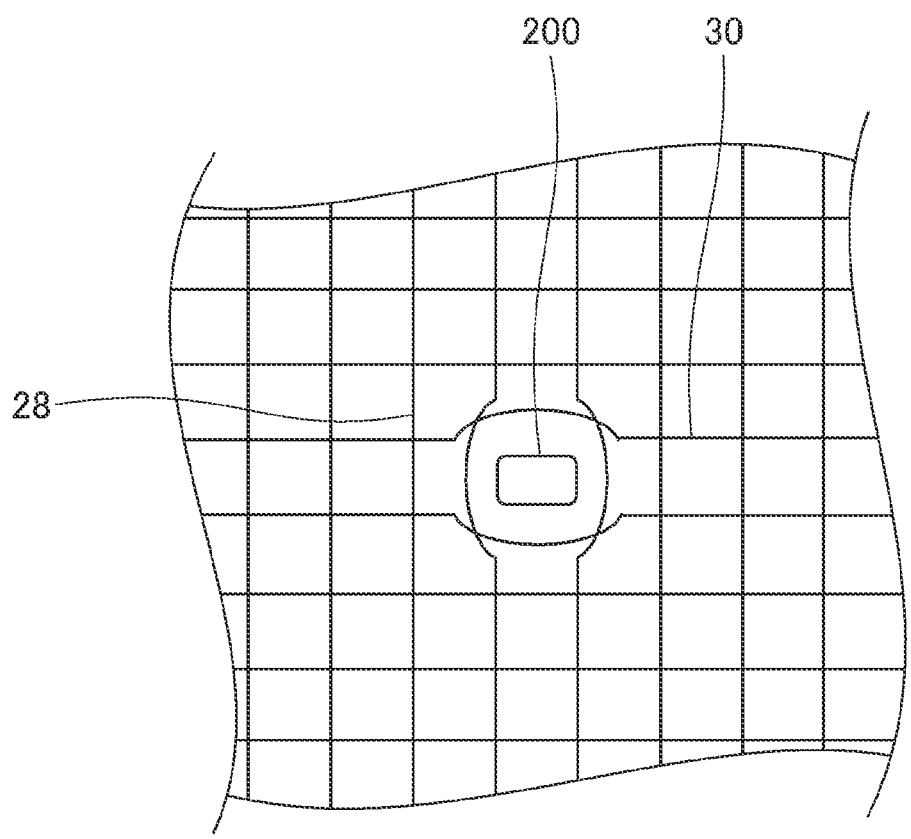
FIG. 5 is a schematic plan view showing peripheries of a through hole forming area in the display panel according to the embodiment.

FIG. 5 is a schematic plan view showing peripheries of the area where the through hole 200 is formed in the display panel 40 in this embodiment. FIG. 5 shows the positional relation between the through hole 200, and the scanning signal line 28 and the video signal line 30.

As shown in FIG. 5, the scanning signal line 28 is arranged in a first direction and the video signal line 30 is arranged in a second direction that intersects the first direction. A subpixel is formed in a rectangular area surrounded by the scanning signal line 28 and the video signal line 30. As described above with reference to FIG. 1, the scanning signal line 28 and the video signal line 30 are electrically connected to the pixel circuit 8 provided in each subpixel.

As shown in FIG. 5, the scanning signal line 28 and the video signal line 30 are arranged in such a way as to detour around the area where the through hole 200 is formed. That is, the scanning signal line 28 and the video signal line 30 arranged next to the through hole 200 are curved to detour around the through hole 200. Such a configuration enables the scanning signal line 28 to electrically connect scanning line drive circuit 20 and the pixel circuit 8 shown in FIG. 1 and enables the video signal line 30 to electrically connect the video line drive circuit 22 and the pixel circuit 8 shown in FIG. 1, without the through hole 200 disconnecting the scanning signal line 28 and the video signal line 30.

Figure 3:
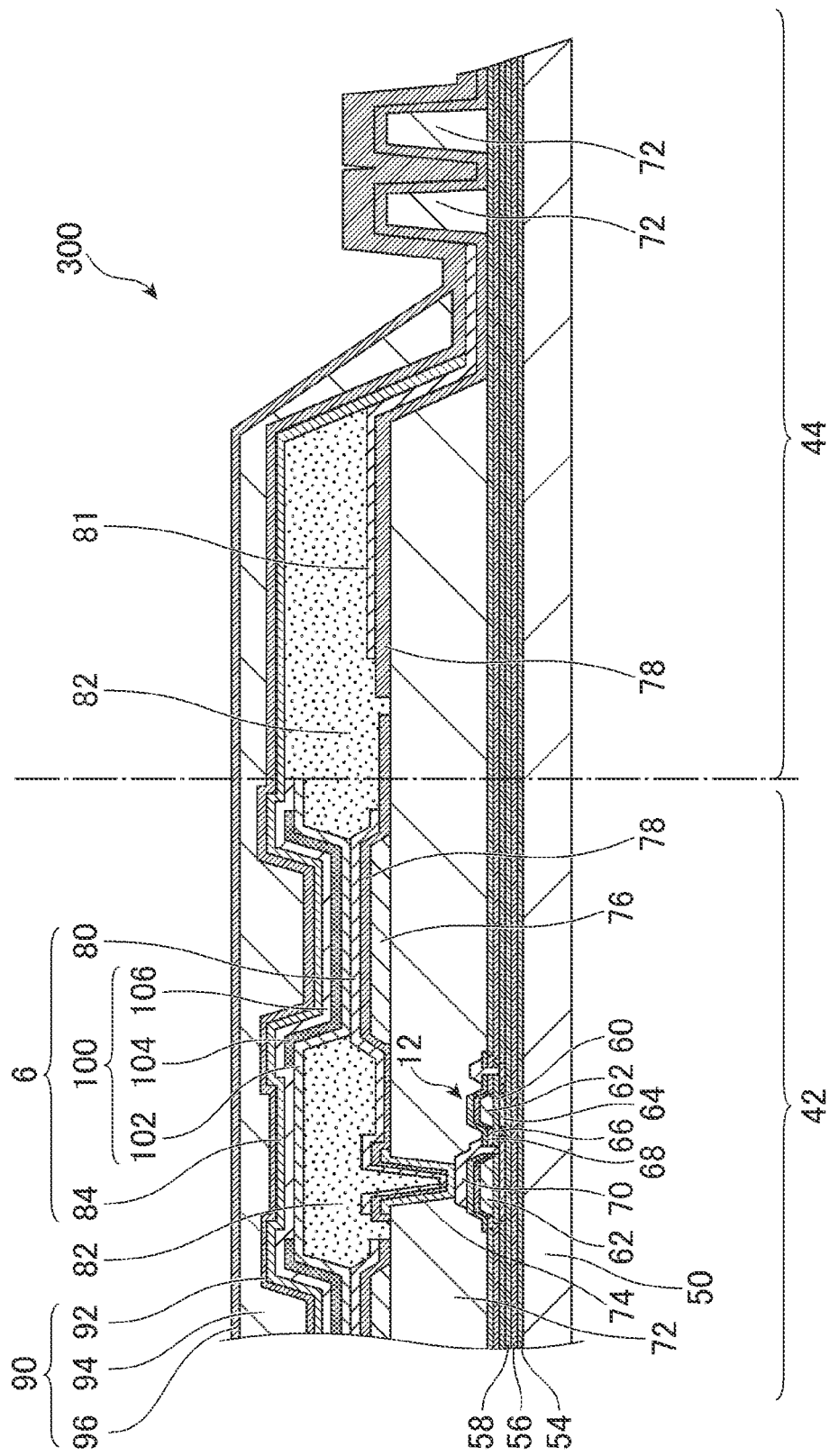
FIG. 3 is a schematic vertical cross-sectional view showing the display panel, taken along III-III shown in FIG. 2.

FIG. 3 is a schematic vertical cross-sectional view showing the display panel 40, taken along III-III shown in FIG. 2, that is, from a part of the display area 42 to the frame area 44. As shown in FIG. 3, the display panel 40 according to this embodiment has an array substrate 50. In this embodiment, polyimide resin is used as the material forming the array substrate 50. Also, another resin material may be used as the material forming the array substrate 50.

Above the array substrate 50, a three-layer structure including a first silicon oxide film 54, a first silicon nitride film 56 and a second silicon oxide film 58 is provided as an undercoat layer. The first silicon oxide film 54, which is the lowermost layer, is provided to improve adhesion to the array substrate 50. The first silicon nitride film 56, which is the middle layer, is provided as a block film against moisture and impurities from outside. The second silicon oxide film 58, which is the uppermost layer, is provided as a block film which prevents hydrogen atoms contained in the first silicon nitride film 56 from being diffused to the semiconductor layer side. It should be noted that the undercoat layer is not particularly limited to this structure and may be a structure having more layers stacked or may be a single-layer structure or two-layer structure.

Above the undercoat layer, the drive thin-film transistor 12 is provided. The drive thin-film transistor 12 has a structure in which a low-concentration impurity region is provided between a channel region and source and drain regions. In this embodiment, a silicon oxide film is used as a gate insulating film 60, and a first wiring 62 constituted by a multilayer structure of Ti and Al is used as a gate electrode. The first wiring 62 also functions as a storage capacitance line in addition to the function as the gate electrode of the drive thin-film transistor 12. That is, the first wiring 62 is used to form a storage capacitance with a polysilicon film 64.

Above the drive thin-film transistor 12, a second silicon nitride film 66 and a third silicon oxide film 68 as interlayer insulating films are stacked. Further, a second wiring 70, forming source and drain electrodes and a lead wiring, is formed. In this embodiment, the second wiring 70 has a three-layer structure of Ti, Al and Ti. The interlayer insulating films, an electrode formed by an electrically conductive layer in the same layer as the first wiring 62 and an electrode formed by an electrically conductive layer in the same layer as the source and drain wirings of the drive thin-film transistor 12 form a storage capacitance. The lead wiring extends to an end part of the peripheral edge of the array substrate 50 and forms a terminal for connecting the flexible printed circuit board 52 and the driver integrated circuit 48 shown in FIG. 2.

Above the drive thin-film transistor 12, a flattening film 72 is formed. As the flattening film 72, an organic material such as photosensitive acrylic resin is often used. The flattening film formed of the organic material 72 has higher surface flatness than an inorganic insulating material film formed by a CVD (chemical vapor deposition) method or the like.

The flattening film 72 is removed at a pixel contact part where the drive thin-film transistor 12 and a lower electrode film 80 included in the organic light-emitting diode 6 are electrically connected to each other and at an end part of the frame area 44. At the pixel contact part, the upper surface of the second wiring 70 exposed by the removal of the flattening film 72 is covered with a transparent conductive film 74 formed of ITO (indium tin oxide).

Subsequently, a third wiring 76 is provided in the same layer as the transparent conductive film 74. In this embodiment, the third wiring 76 is provided as a three-layer structure of Mo, Al and Mo and is used to form a peripheral lead wiring and a capacitance element provided additionally in the pixel. Covering the upper surface of the second wiring 70 exposed after the removal of the flattening film 72, with the transparent conductive film 74 as described above, also serves to protect the exposed surface of the second wiring 70 from the process of patterning the third wiring 76.

The upper surfaces of the transparent conductive film 74 and the third wiring 76 are first covered with a third silicon nitride film 78. Subsequently, near the pixel contact part of the transparent conductive film 74 in the display area 42, an opening is provided in the third silicon nitride film 78. A part of the upper surface of the transparent conductive film 74 is thus exposed. In this embodiment, an opening is provided in the third silicon nitride film 78 also in the frame area 44. The upper surface of the flattening film 72 is exposed at the opening.

Subsequently, the lower electrode film 80 to be the pixel electrode is formed in such a way as to be connected to the upper surface of the transparent conductive film 74 exposed at the opening. In this embodiment, the lower electrode film 80 is formed as a reflection electrode and has a three-layer structure formed of IZO, Ag and IZO, or ITO, Ag and ITO or the like. At the pixel contact part, the transparent conductive film 74, the third silicon nitride film 78 and the lower electrode film 80 form an added capacitance. Incidentally, at the time of patterning the lower electrode film 80, the transparent conductive film 74 is partly exposed to the etching environment. However, due to annealing carried out after the process of forming the transparent conductive film 74 and before the process of forming the lower electrode film 80, the transparent conductive film 74 has endurance to the etching of the lower electrode film 80.

In this embodiment, at the time of forming the lower electrode film 80, an electrically conductive film 81 formed of the same electrically conductive material as the lower electrode film 80 is formed on the third silicon nitride film 78 in the frame area 44. In the frame area 44, the third silicon nitride film 78 has the opening and the electrically conductive film 81 is not formed on this opening. That is, the upper surface of the flattening film 72 is exposed at the opening in the third silicon nitride film 78.

This opening is provided to extract, through an organic insulating film 82, moisture and gas released from the flattening film 72 by heat treatment or the like after the process of forming the organic insulating film 82. Therefore, providing an opening not only in the display area 42 but also in the frame area 44 as described in this embodiment enables efficient removal of moisture and gas released from the flattening film 72 in the frame area 44.

As the electrically conductive material used for the electrically conductive film 81, an electrically conductive material that is different from that of the lower electrode film 80 may be used. However, using the same material is desirable because the electrically conductive film 81 and the lower electrode film 80 can be formed simultaneously.

After the process of forming the lower electrode film 80, the organic insulating film 82 to be the partition wall of the pixel area, called bank or rib, is formed. As the organic insulating film 82, photosensitive acrylic resin, photosensitive polyimide resin or the like is used as with the flattening film 72. The organic insulating film 82 has an opening to expose the upper surface of the lower electrode film 80 as a light-emitting area. It is preferable that the edge of the opening is gently tapered. If the edge of the opening is steeply tapered, it causes a coverage defect in an organic electroluminescence layer 100 which is formed later.

Here, in this embodiment, the organic insulating film 82 is formed in such a way as to close the opening provided in the electrically conductive film 81 and the third silicon nitride film 78 in the frame area 44. That is, a part of the organic insulating film 82 enters the openings, as shown in FIG. 3. Forming the organic insulating film 82 in such a way as to close the opening in the third silicon nitride film 78 can suppress melting or dissolution of the inner peripheral surface of the opening in the third silicon nitride film 78 in the subsequent process.

After the organic insulating film 82 is formed, organic materials forming the organic electroluminescence layer 100 are stacked as multiple layers. As the multilayer structure forming the organic electroluminescence layer 100, a hole transport layer 102, a light-emitting layer 104 and an electron transport layer 106 are stacked in order from the side of the lower electrode film 80. In this embodiment, the hole transport layer 102 and the electron transport layer 106 are formed over a plurality of subpixels, and the light-emitting layer 104 is formed for each subpixel. The organic electroluminescence layer 100 may be formed by vapor deposition or may be formed by coating solution or dispersion. The organic electroluminescence layer 100 may be selectively formed for each subpixel or may be formed as a layer over the entire surface covering the display area 42. If the organic electroluminescence layer 100 is formed as a layer, a configuration to obtain white light at all the subpixels and then extract a desired color wavelength portion by a color filter (not illustrated) can be employed. In this embodiment, the organic electroluminescence layer 100 is selectively formed for each subpixel.

After the organic electroluminescence layer 100 is formed, an upper electrode film 84 is formed. In this embodiment, since a top-emission structure is employed, the upper electrode film 84 is formed using a transparent conductive material such as IZO (indium zinc oxide) and a semitransparent electrode material such as Mg—Ag (magnesium-silver alloy). According to the order of forming the organic electroluminescence layer 100, the lower electrode film 80 is the anode and the upper electrode film 84 is the cathode. The upper electrode film 84, the organic electroluminescence layer 100 and the lower electrode film 80 form the organic light-emitting diode 6. The lower electrode film 80 of the organic light-emitting diode 6 is connected to the drive thin-film transistor 12.

After the upper electrode film 84 is formed, a protection layer 90 is formed. One of the functions of the protection layer 90 is to prevent infiltration of outside moisture into the organic electroluminescence layer 100, which is formed earlier. In this case, the protection layer 90 needs to have a high gas barrier property. In this embodiment, as the multilayer structure of the protection layer 90, a multilayer structure including an inorganic film 92 such as a silicon nitride film or a multilayer film constituted by a silicon oxide film and a nitride film, an organic resin film 94 formed of an acrylic resin or the like, and an inorganic film 96 such as a silicon nitride film or a multilayer film constituted by a silicon oxide film and a nitride film is employed.

As shown in FIG. 3, a part of the upper electrode film 84 is provided, ranging from the upper surface to the lateral surface of the organic insulating film 82. The upper surface of the electrically conductive film 81 provided on the lower surface of the organic insulating film 82, and the lower surface of the upper electrode film 84 are electrically connected to each other in the area where the organic insulating film 82 is not formed.

In the frame area 44 shown in FIG. 3, in order to avoid exposing the upper electrode film 84 at the end surface of the display panel 40, the opening width of a mask used at the time of forming the upper electrode film 84 may be adjusted so that, for example, the upper electrode film 84 is arranged only in the display area 42 and is not arranged in the frame area 44.

Figure 4:
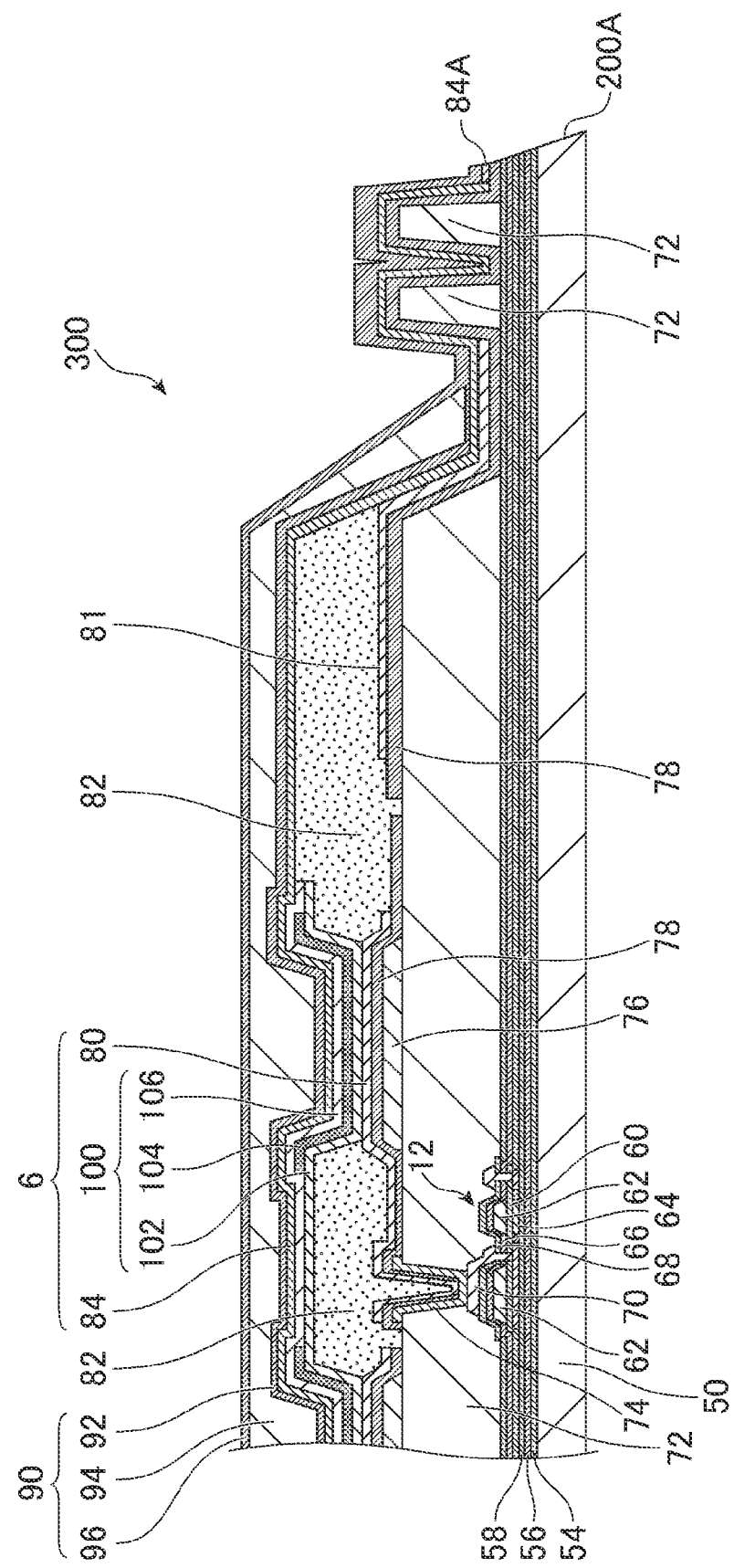
FIG. 4 is a schematic vertical cross-sectional view showing the display panel, taken along IV-IV shown in FIG. 2.

FIG. 4 is a schematic vertical cross-sectional view showing the display panel 40, taken along IV-IV shown in FIG. 2, that is, at a position where the through hole 200A is provided in the display area 42. As shown in FIG. 4, the through hole 200A penetrates the array substrate 50 and the upper electrode film 84, and a part of the upper electrode film 84 is exposed at the inner surface of the through hole 200A. In this embodiment, since the upper electrode film 84 is formed substantially in the entirety of the display area 42, as described above, a part of the upper electrode film 84 is exposed at the inner surface of the through hole 200 formed in the display area 42.

In this embodiment, the surface of the upper electrode film 84 exposed at this through hole 200 is oxidized. Thus, an oxidized part 84A is exposed at the inner surface of the through hole 200. As a method for forming the oxidized part 84A, for example, a laser beam is irradiated at the time of forming the through hole 200 in the display area 42. In this process, the through hole 200 is formed and at the same time the surface of the upper electrode film 84 exposed at the inner surface of the through hole 200 is oxidized by the heat of the laser beam, thus forming the oxidized part 84A.

The method for forming the oxidized part 84A is not limited to the irradiation with a laser beam. For example, after the through hole 200 is mechanically formed, the inner surface of the through hole 200 may be heat-treated to form the oxidized part 84A.

With such a configuration, the oxidized part 84A suppresses infiltration of moisture film 84 from the inner surface of the through hole 200 via the upper electrode. Thus, the occurrence of a defect in the organic electroluminescence layer can be suppressed.

Since a manufacturing method in which the upper electrode film 84 is formed by a single film forming process using a single mask is employed, improved quality of the upper electrode film 84 can be expected. That is, while it is possible to suppress infiltration of moisture by using a plurality of film forming processes using a plurality of masks and thus forming the upper electrode film 84 in which the area to form the through hole 200 is removed in advance so that the upper electrode film 84 is not exposed at the through hole 200, such a manufacturing method may result in a plurality of upper electrode films 84 overlapping each other in a boundary area due to misalignment in film formation or the like. If a plurality of upper electrode films 84 overlap each other at a part, the film thickness at that part becomes thick. Meanwhile, a manufacturing method which includes forming the upper electrode film 84 over a plurality of pixels by a single film forming process using a single mask and subsequently the step of providing the through hole 200 and the step of providing the oxidized part 84A, as in this embodiment, can achieve the state where the upper electrode film 84 has a shape as a single film that surrounds the peripheries of the through hole 200, as shown in FIG. 2, and where the upper electrode film 84 exposed at the inner surface of the through hole 200 is oxidized. As a result, both improved quality of the upper electrode film 84 and a configuration to suppress infiltration of moisture can be achieved. As described above, the step of providing the through hole 200 and the step of providing the oxidized part 84A may be carried out simultaneously or as separate steps.

A person skilled in the art can readily think of various changes and modifications within the technical scope of the invention. Such changes and modifications should be understood as being within the scope of the invention. For example, addition, deletion or design change of a component, or addition, omission or condition change of a process, made by a person skilled in the art to each of the embodiments, is included in the scope of the invention, provided that it has essential features of the invention.

What is claimed is:

1. A display device comprising:
a display panel having a through hole in a display area including a plurality of pixels,
wherein the display panel includes
a substrate, and
an organic light-emitting diode including a first electrode provided above the substrate for each of the plurality of pixels, a second electrode provided over the plurality of pixels, and an organic electroluminescence layer arranged between the first electrode and the second electrode,
the through hole penetrates at least the second electrode, and
the second electrode includes an oxidized part exposed at an inner surface of the through hole and not overlapping the through hole in a plan view.

2. The display device according to claim 1, wherein the through hole also penetrate the substrate.

3. The display device according to claim 1, wherein the second electrode has a shape as a single film that surrounds peripheries of the through hole.

4. The display device according to claim 1, further comprising:
a pixel circuit provided in the plurality of pixels;
a video signal line which supplies a voltage corresponding to a video signal, to the pixel circuit; and
a scanning signal line which applies a voltage to a lighting thin-film transistor included in the pixel circuit,
wherein the video signal line and the scanning signal line arranged next to the through hole are curved to detour around the through hole.

5. The display device according to claim 1, wherein
a structure other than the display panel is arranged at a position corresponding to the through hole.

6. The display device according to claim 5, wherein
the structure includes at least one of camera, earphone, and microphone.

7. A method of manufacturing a display device that includes a display panel having a display area including a plurality of pixels, the method comprising:
forming an organic light-emitting diode which includes a first electrode provided above a substrate for each of plurality of the pixels, a second electrode provided over the plurality of pixels, and an organic electroluminescence layer arranged between the first electrode and the second electrode;
providing a through hole which exposes a part of the second electrode, in the display area; and
oxidizing a part of the second electrode exposed at an inner surface of the through hole so that the part does not overlap the through hole in a plan view.

8. The method for manufacturing the display device according to claim 7, wherein
a laser beam is irradiated in the display area, thus simultaneously carrying out
the providing the through hole, and
the oxidizing a part of the second electrode.

9. The method of manufacturing the display device according to claim 7, wherein
the second electrode is formed by a single film forming process using a single mask.

* * * * *